United States Patent
Marcus et al.

(10) Patent No.: US 6,183,267 B1
(45) Date of Patent: Feb. 6, 2001

(54) ULTRA-MINIATURE ELECTRICAL CONTACTS AND METHOD OF MANUFACTURE

(75) Inventors: Robert B. Marcus, New Providence; Igor V. Kadija, Ridgewood; Robert Reuven Aharonov, Rockaway, all of NJ (US)

(73) Assignee: Murray Hill Devices, Murray Hill, NJ (US)

( * ) Notice: Under 35 U.S.C. 154(b), the term of this patent shall be extended for 0 days.

(21) Appl. No.: 09/266,300

(22) Filed: Mar. 11, 1999

(51) Int. Cl.$^7$ ............................... H01R 4/58; H05K 1/00
(52) U.S. Cl. ................................. 439/66; 439/91
(58) Field of Search ................ 439/66, 91, 591; 324/754; 438/117; 428/615

(56) References Cited

U.S. PATENT DOCUMENTS

| | | | |
|---|---|---|---|
| 3,842,189 | * 10/1974 | Southgate | 174/52 S |
| 5,172,050 | 12/1992 | Swapp | 324/158 P |
| 5,476,211 | 12/1995 | Khandros | 28/180.5 |
| 5,510,721 | 4/1996 | Walles et al. | 324/754 |
| 5,601,740 | 2/1997 | Eldridge et al. | 219/130.4 |
| 5,613,861 | 3/1997 | Smith et al. | 439/81 |
| 5,632,631 | 5/1997 | Fjeistad et al. | 439/82 |
| 5,665,648 | 9/1997 | Little | 438/117 |
| 5,772,451 | 6/1998 | Dozer, II et al. | 439/70 |
| 5,773,780 | 6/1998 | Eldridge et al. | 219/56.22 |
| 5,806,181 | 9/1998 | Khandros et al. | 29/874 |
| 5,926,951 | * 7/1999 | Khandros et al. | 29/843 |

* cited by examiner

Primary Examiner—Brian Sircus
Assistant Examiner—Chandrika Prasad
(74) Attorney, Agent, or Firm—Irwin Ostroff; Edward Brandeau

(57) ABSTRACT

Ultra-miniature electrical contacts are provided with the strength and resilience necessary to give stable low resistance connection, to minute areas of a device, such as a thousand or so closely spaced surface pads of an integrated circuit. Each contact is initially formed on a substrate as a thin, narrow elongated flat body comprised of selectively deposited layers of metal. Depending on the final configuration desired for the contact, the metal of one metal layer has a coefficient of thermal expansion such as chromium (Cr), and the metal of another layer has a coefficient of thermal expansion such as copper (Cu). Each contact is permanently formed (by differential expansion of the metal layers when heated) into a three-dimensional structure and is then made "robust" by a covering of a specialized stiffening metal plating which adds substantial strength to the contact. This also makes the contact "springy" and enables the contact to be deformed substantially without permanent deformation or "set". Such ultra-miniature contacts are made using photolithography and techniques for deposition of metals and other materials onto a substrate, as commonly used in the semiconductor industry.

21 Claims, 5 Drawing Sheets

ULTRA-MINIATURE ELECTRICAL CONTACTS AND METHOD OF MANUFACTURE

CROSS-REFERENCE TO RELATED PATENT APPLICATION

This application is related to U.S. patent application Ser. No. 08/942,623, filed Oct. 2, 1997, with inventors Robert B. Marcus and Yanwei Zhang, and entitled "Micromachined Element And Method Of Fabrication Thereof". This above identified application is incorporated herein by reference.

FIELD OF THE INVENTION

This invention relates to ultra-miniature electrical contacts which are small enough and robust enough to make contact directly and reliably to micron size areas at any of numerous contact points on the face of an integrated circuit (IC), for example.

BACKGROUND OF THE INVENTION

As integrated circuits (ICs) become denser and denser with thousands and even millions of devices (e.g., memory cells, gates, etc.) on a single chip, the problem of making connections between external circuits and the devices on the chip becomes increasingly difficult. Frequently, a chip is encapsulated in a package with contacts on the chip permanently connected (e.g., by wire bonding, or otherwise), to relatively large external contacts on the package, such as the pins on a dual in-line package (DIP). Especially where the devices on an IC operate at speeds in the gigahertz ($GH_z$) range, this method of connecting the internal devices on the chip to external circuits can cause impedance mismatching and imposes undesirable restraints on the overall speed of operation as well as significant added costs. It would therefore be highly desirable to be able to make connections directly to the devices on the chip with minimal physical separation from other devices, or from one chip to another.

Another widely used way to make connections to an IC is by means of solder "bumps" positioned in a pattern either on a substrate that matches the locations of the solder bumps to respective locations of small surface pads on the IC, or on the IC itself. The solder bumps are pressed against the pads and then reflowed thereby making permanent interconnections all at once. However, one disadvantage with this way of interconnection is that it results in a very rigid composite structure. The IC and substrate are held closely together with perhaps a thousand soldered joints. Unless the coefficients of thermal expansion of the IC and of the substrate are closely matched, differential expansion of the members when temperature changes during operation can cause rupture of an interconnection or fracture of the IC or substrate. It is highly desirable therefore that interconnections between an IC and a substrate be at least somewhat mechanically compliant. The present invention provides interconnections which while stable and low in resistance are also compliant.

From a cost standpoint, it would also be highly desirable in order to meet any particular or specific application to be able to assemble into an overall circuit individual off-the-shelf chips before they are sealed into separate packages. In order to do this to do this it must be possible to test the operation of the circuit and its individual chips before final packaging. Testing should be under conditions as nearly as possible equal to actual operating conditions. This also means as a practical matter that one or more individual ICs in the overall circuit, in the event the circuit does not operate properly for a particular application, should be easily replaceable even though the individual IC has met general specifications for itself alone.

In the past there have been various attempts to provide electrical contacts which meet the needs outlined above. Most if not all such attempts have been not entirely successful because of one or more shortcomings such as: not sufficiently small in size; or without adequate robustness to make stable electrical connections directly to contact pads on the face of an IC, or without adequate compliance to repeatedly make contact to surface pads without permanent deformation or "set", or without ease of manufacturing and of assembly with the necessary high degrees of mechanical precision and electrical performance.

As is well known in the art of electrical connections, a prime requirement for an electrical contact is that it be able to make a stable and low resistance connection. To do this a contact should itself have high conductivity and enough physical strength (i.e., be robust enough) to exert adequate force against the member it is contacting. A contact should also act against the member to break through or scrape away any oxide (or high resistance film) on the surface between contact and member. These requirements for stability and low resistance are extremely difficult to meet when it is also necessary that the size of contacts be minute enough to make simultaneous electrical connections to a thousand or so micron-size contact pads (e.g., 80 or so microns square) on an IC.

The present invention provides ultra-miniature electrical contacts which are strong yet compliant, together with an efficient method of manufacturing and of precision assembly into electrical connectors, especially suitable for stable, low resistance temporary and/or permanent connections to the closely spaced area array and/or edge array contact pods of very dense ICs. The present invention is an important improvement upon that described in U.S. patent application, Ser. No. 08/942,623, filed Oct. 2, 1997, in the names of Robert B. Marcus and Yanwei Zhang. The disclosure in said patent application is referred to herein and is explicitly incorporated by reference into the present application.

SUMMARY OF THE INVENTION

In accordance with one aspect of the invention there are provided ultra-miniature electrical contacts having improved performance and versatility. The design of one such contact insures that when it is pressed down against a surface pad on an IC for example, the contact wipes against the pad and breaks through or scrapes away oxide or other high resistance film on the face of the pad. The contact is of high-conductivity material and has ample strength and resilience to bear against the pad with enough force to insure stable, low resistance electrical contact Each contact is initially formed on a substrate as a thin, narrow elongated flat body comprised of selectively deposited layers of metal. Depending on the final configuration desired for the contact, as illustrated hereinafter, the metal of a first metal layer has a first coefficient of thermal expansion ($\alpha 1$), and the metal of another layer has a second thermal coefficient ($\alpha 2$), which is different from $\alpha 1$. Each contact is formed into a three-dimensional structure (as will be explained hereinafter) and is then made strong by a covering of a specialized metal plating which adds substantial stiffness and strength to the contact. This also makes the contact "springy" (compliant) and enables the contact to be deformed substantially without permanent deformation or "set", a characteristic highly important to multiple electrical contacts making connections to a large number of surface pads on a chip or to the surface pads on many chips in a planar array. This is especially so when making repeated connections to one IC after another, as with a probe card for example.

Electrical contacts according to the invention are advantageously fabricated en masse on closely spaced and precisely located centers by photolithography, and selective deposition of metals and other materials through a series of process steps akin to ones employed in semiconductor manufacturing and which are well known. By way of example, ultra-miniature electrical contacts in accordance with the present invention are produced by: (a) providing a substrate, such as a silicon wafer, and depositing a thin insulating layer thereon, such as silicon nitride ($Si_3N_4$); (b) depositing a thin sacrificial layer, such as $SiO_2$; (c) patterning the sacrificial layer using photolithography, so that strips of the sacrificial layer left after patterning define, at least roughly, the outline in planar form of each such electrical contact; (d) defining photographically the regions for metal deposition with photo resist thicker than the thickness of the metal to be deposited; (e) depositing (e.g., by sputtering) a layer of metal having a first coefficient of thermal expansion; (f) removing the resist along with unwanted metal; (g) depositing and patterning photoresist for a second layer of metal; (h) selectively depositing (e.g., by sputtering) a layer of metal having a thermal coefficient of expansion different from the first; (i) removing the resist along with unwanted portions of metal; (j) removing the sacrificial layer (e.g., using hydroflouric acid); (k) heating the planar contacts to "curl" or form them into three-dimensional shapes of desired configuration; and (l) substantially strengthening the contacts by electroplating over them specialized stiffening metal. In addition special contact areas may be applied to each electrical contact to provide a surface-scraping action when pressed against another contact member, such as a surface pad on an integrated circuit (IC).

In accordance with another apparatus aspect, the present invention is directed to an ultra-miniature electrical contact which has an elongated conductive body formed of at least two layers of different metals selectively deposited upon each other, a portion of the contact being adapted to be fixed to a substrate, another portion of the contact being permanently bent above the substrate as a result of differential expansion of metal layers, and an outer stiffening metal layer being deposited over the plurality of metal layers, such that the contact has sufficient strength and resilience to effect stable low-resistance connection to another contact member.

Viewed from another apparatus aspect, the present invention is directed to an ultra-miniature electrical contact comprising an elongated conductive body having two ends and formed of at least three layers of metals selectively deposited upon each other. The layers comprise an inner layer, a middle layer, and an outer layer with the middle layer being located between at least one portion of each of the inner and outer layers, the middle metal layer having a coefficient of thermal expansion that is different from that of other layers. One end of the body of the contact is adapted to be affixed to a substrate. The body of the contact is bent above the one end of the contact and the substrate. At least a portion of the body of the contact near its other end is bent down toward the substrate by differential expansion of metal layers.

Viewed from another apparatus aspect, the present invention is directed to an ultra-miniature electrical contact comprising an elongated conductive body formed of a plurality of two or more layers of different metals selectively deposited upon each other and an outer stiffening metal layer. A portion of the contact is adapted to be fixed to a substrate. Another portion of the contact is permanently bent above the substrate as a result of differential expansion of metal layers. An outer stiffening metal layer is deposited over the plurality of metal layers such that the contact has sufficient strength and resilience to effect stable low-resistance connection to another contact member.

Viewed from another apparatus aspect, the present invention is directed to an assembly of ultra-miniature electrical contacts mounted on a substrate and suitable for contacting contact areas of a device such as an integrated circuit. At least one of the ultra-miniature electrical contacts comprises an elongated conductive body having two ends and formed of at least three layers of metals selectively deposited upon each other. One inner metal layer has a coefficient of thermal expansion that is different from that of other layers. One end of the body of the contact is adapted to be affixed to the substrate, the body of the contact by differential expansion of metal layers being bent above the one fixed end of the contact and the substrate. At least a portion of the body of the contact near its other end is bent down toward the substrate as a result of differential expansion of metal layers. An outer stiffening metal layer is electrodeposited on the other layers to give substantial strength and resiliency to the contact.

Viewed from another apparatus aspect, the present invention is directed to an assembly of ultra-miniature electrical contacts mounted on a substrate and suitable for contacting surface pads of a device such as an integrated circuit (IC). The assembly comprises a substrate with an elongated conductive body formed on the substrate as a plurality of layers of different metals selectively deposited upon each other. A portion of the contact is affixed to the substrate. A remaining portion of the contact is permanently bent into a three-dimensional shape above the substrate as a result of differential expansion of metal layers. An outer stiffening metal layer is deposited over the plurality of metal layers such that the contact has sufficient strength and resilience to effect stable low-resistance connection to a surface pad of an IC device.

Viewed from a method aspect, the present invention is directed to a method of forming ultra-miniature electrical contacts. The method comprises the steps of: defining by photolithography an elongated area or areas on a substrate; selectively depositing within each area an inner layer, a middle layer, and an outer layer of metals deposited upon each other to form a conductive body of the contact with the middle metal layer having a coefficient of thermal expansion higher than that of other layers and one end of the contact being fixed to the substrate; and heating the body of the contact so that by differential expansion of the metal layers the contact for most of its length beyond its fixed end is bent above the substrate, and at least a portion of the body near its other end is bent down toward the substrate.

Viewed from another method aspect, the present invention is directed to a method of forming ultra-miniature electrical contacts. The method comprises the steps of: defining by photolithography an elongated area or areas on a substrate; selectively depositing within each area a plurality of layers of metal upon each other to form a conductive body of a contact with one metal layer having a coefficient of thermal expansion higher than that of another layer and one end of the contact being fixed to the substrate; heating the body of the contact so that by differential expansion of metal layers the contact for most of its length beyond its fixed end is bent above the substrate, and at least a portion of the body near its other end is bent down toward the substrate; and over-plating with an outer stiffening metal layer the other metal layers to give substantial strength and resiliency to the contact.

In accordance with yet another method aspect, the present invention is directed to a method of forming an assembly of ultra-miniature electrical contacts mounted on a substrate and suitable for contacting contact areas of a device such as surface pads of an integrated circuit (IC). The method comprises the steps of: providing an insulated substrate on which a pattern of conductive circuit traces can be deposited; defining by photolithography elongated areas on the substrate where contacts are to be located; depositing in each of the defined areas an elongated conductive body of a contact having a plurality of layers of different metals selectively plated upon each other, an end portion of one metal layer being connected to a portion of conductive traces on the substrate; heating each contact body so that by differential expansion of the metal layers the contact is permanently bent into a three-dimensional shape above the substrate; and depositing an outer stiffening metal layer over the plurality of metal layers so that the contacts have sufficient strength and resilience to effect stable lowresistance resistance connection to contact areas of a device such as surface pads of an IC.

A better understanding of the invention together with a fuller appreciation of its many advantages will best be gained from a study of the following description given in connection with the accompanying drawing and claims.

The drawings are not necessarily to scale.

DETAILED DESCRIPTION

Figure 1:
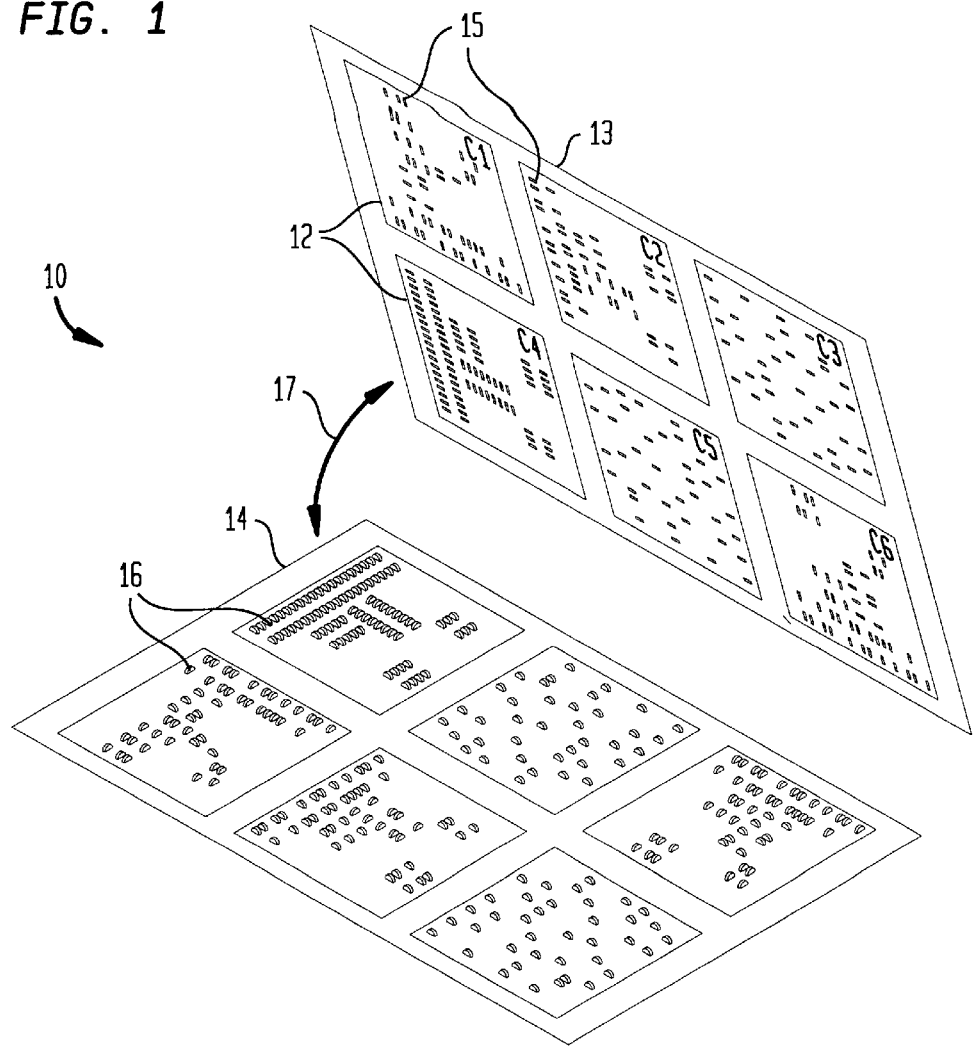
FIG. 1 is a schematic plan (top) view showing in exploded relation an electrical circuit assembly of individual circuit chips in a planar array which are interconnected by means of ultra-miniature surface-contacting electrical contacts mounted on a substrate and provided in accordance with the present invention.

Referring now to FIG. 1, there is shown in schematic form a plan (top) view of an electrical circuit assembly 10 of a variety of chips 12 that may contain integrated circuits (ICs) microlectronic and/or sensor devices, etc. (designated C1 through C6) and mounted as a planar array on a support card 13. The chips 12 which have surface pads 15 facing "up" are electrically interconnected by a mating substrate 14 (shown in exploded relation to the chips 12 and the support card 13) having an array of ultra-miniature surface-contacting electrical contacts, generally indicated at 16, and provided in accordance with the present invention. The ultra-miniature contacts 16 at their lower ends are mounted on the substrate 14 and interconnected in a desired pattern by conductive circuit traces (not shown). One or more of the chips 12 can be removed from the support card 13 during testing and before final encapsulation of the assembly 10 of chips 12 and contacts 16 can be tested under actual, or nearly actual operating conditions, and one or more chips 12 can easily be removed and replaced to achieve optimum performance of the overall circuit. This is an important advantage provided by the present invention. It is to be understood that when the planar array of chips 12 on the surface card 13 is mated (as illustrated by an arrow 17) with the substrate 14 and its array of contacts 16 each contact 16 makes stable electrical connection to a respective surface pad 15 on the faces of the chips 12. This will be explained in greater detail hereinafter.

Figure 2:
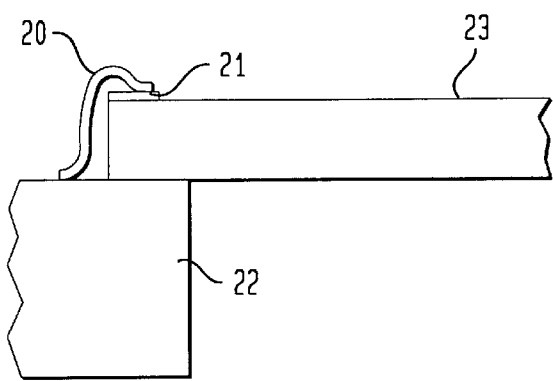
FIG. 2 is a greatly enlarged schematic side view of an is ultra-miniature card-edge electrical contact (clip) also provided by the invention and showing it making contact to a surface pad on the edge of a circuit chip.

Referring now to FIG. 2, there is shown, greatly enlarged, a schematic side view of an ultra-miniature card-edge electrical contact 20, and a portion of a board 22 on which one or more such contacts are mounted. As was mentioned previously in connection with the contacts 16, the lower ends of the contacts 20 are interconnected in a desired pattern by conductive circuit traces (not shown) on the board 22. Each contact 20 makes connection to a respective one of surface pads 21 spaced along an edge of a chip 23, for example.

As was explained previously ultra-miniature electrical contacts in accordance with the present invention are advantageously produced by the following process steps: (a) providing a substrate, such as a silicon wafer; (b) depositing an insulating layer thereon, such as silicon nitride ($Si_3N_4$); (c) depositing a sacrificial layer, such as $SiO_2$; (d) patterning the sacrificial layer using photolithography, so that strips of the layer left after patterning define, at least roughly, the outline in planar form of each such electrical contact; (e) defining photographically the regions for metal deposition with plating resist thicker than the thickness of the layers of metal to be used; (f) selectively depositing a layer of metal having a first coefficient of thermal expansion $\alpha 1$; g) depositing a layer of metal having a second coefficient of thermal expansion α2 different from the first coefficient α1; (h) removing the resist along with unwanted portions of metal; (i) removing the sacrificial layer; (j) briefly heating the planar contacts to raise them partially above their substrate and form them into three-dimensional shapes of desired configuration; and (k) substantially strengthening the contacts by electroplating over them specialized stiffening metal. Specific details of the process steps outlined above are well known to those skilled in the art and are not further described herein. It is to be understood that the substrate 14 (or the board 22), during fabrication of the electrical contacts 16 (or the contacts 20), can have patterned on it interconnecting conductive circuit traces (not shown) to which respective ends of the contacts 16 (or the contacts 20) are connected during fabrication of the contacts. Techniques for forming such circuit traces are well known. It is also to be understood that for good adhesion to the contacts to the insulating layer (where exposed by the sacrificial layer) a very thin layer (e.g., a few nanometers thick) of a metal such as chromium or titanium may be deposited. The adhesion layer is so thin compared to the metal layers forming the body of each contact that other physical properties of the adhesion layer such as coefficient of thermal expansion are relatively unimportant.

Figure 3:
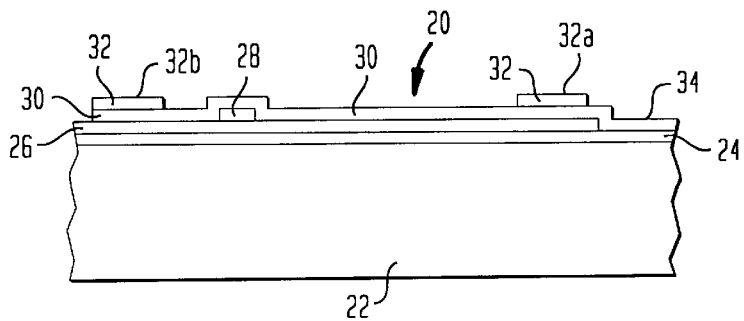
FIG. 3 is a schematic side view of the ultra-miniature card-edge electrical contact of FIG. 2 at one stage of its fabrication in accordance with a method of the present invention.

Referring now to FIG. 3, there is shown an enlarged schematic side view, not to scale, of a partially fabricated ultra-miniature card-edge electrical contact 20 still in planar form. The structure shown here comprises the board 22 (partially broken away); a layer of insulation 24 (e.g., $Si_3N_4$); a thin sacrificial layer 26 (e.g., $SiO_2$); a short, selectively deposited (e.g., by sputtering) layer 28 of metal (e.g., Cr) with a relatively low coefficient of thermal expansion; a second extensive layer 30 of metal (e.g., Cu) with a higher coefficient of thermal expansion than that of the layer 28; and a third selectively deposited layer 32 of metal (e.g., Cr) in two portions 32a and 32b with a thermal coefficient of expansion like to that of the layer 28. The extensive metal layer 30 forms the main body of the contact 20 and is joined at a fixed end 34 onto a portion of a conductive circuit trace (not shown) and the insulating layer 24. The contact 20 is thereby precisely located and interconnected in a desired pattern with other circuit elements (not shown) and the insulating layer 24. Other details in the fabrication of the contact 20, such as a very thin metal adhesion layer, are not shown herein.

Figure 4:
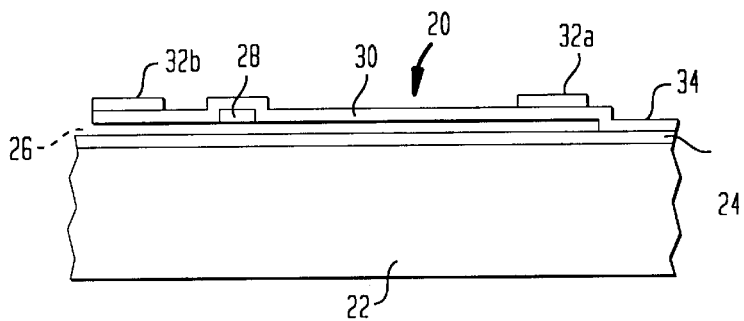
FIG. 4 is a view similar to FIG. 3 but at a later stage of fabrication of the contact.

Referring to FIG. 4, the ultra-miniature card-edge contact 20, still in planar form is shown after the sacrificial layer 26 has been removed (e.g., by hydroflouric acid) as here indicated by a dashed line. This frees the body of the contact 20 along its length, except for the fixed end 34, so that it subsequently is able to move away from the test board 22.

Figure 5:
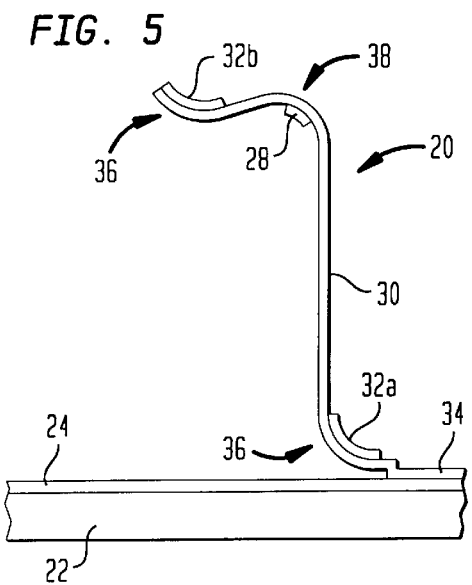
FIG. 5 is a view of the electrical contact of FIG. 4 after the contact has been formed into a three-dimensional shape.

Referring to FIG. 5, the ultra-miniature card-edge contact 20 has been formed into the three-dimensional shape shown by briefly heating (e.g., at a suitable temperature above 300° C.). The differential expansion during heating of the metal layer 30 (e.g., Cu) relative to the metal layers 32a, 32b, (e.g., Cr) plated on top of the layer 30 causes the permanent upward bends indicated at 36 in the contact 20. Similarly the differential expansion during heating of the metal layer 30 relative to the metal layer 28 (e.g., Cr) plated underneath the layer 30 causes a permanent downward bend indicated at 38. By controlling the respective lengths and placement of the layers 28 and 32a, 32b and their thicknesses relative to that of the layer 30, the card-edge contact 20 can be given various desired shapes.

Figure 6:
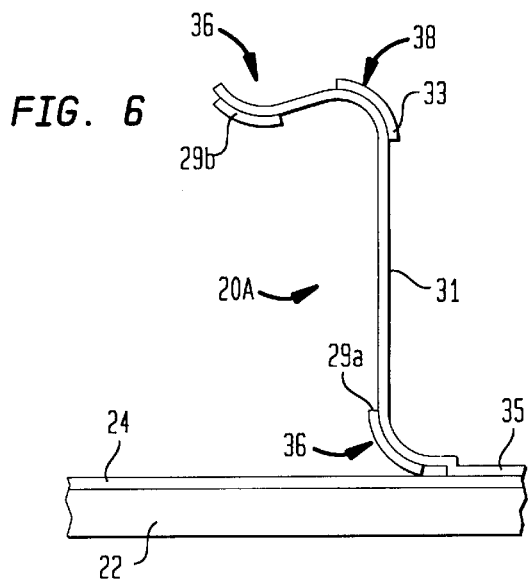
FIG. 6 is a view of a partially fabricated electrical contact closely similar to the contact shown in FIG. 5.

Referring now to FIG. 6, there is shown a partially fabricated ultra-miniature card-edge contact 20A, which is closely similar to the contact 20 (FIG. 5) after it has been formed into a three-dimensional shape by briefly heating (e.g., at a suitable temperature above 300° C.). Here, the contact 20A has a first or inner metal layer 29 formed in two short-length portions 29a and 29b, a second or middle full length metal layer 31, and a third or outer short length metal layer 33. The layers 29a, 29b, 31 and 33 are selectively deposited upon each other in a series of steps closely similar to those illustrated in FIGS. 3 and 4 for the contact 20. As seen in FIG. 6, the metal layer parts 29a and 29b (e.g., Cu) have a higher coefficient of thermal expansion than that of the middle metal layer 31 (e.g., Cr), and the outer metal layer 33 (e.g., Cu) has a higher coefficient of thermal expansion than that of the middle layer 31. As a result the contact 20A has the same upward bends 36 and the same downward bend 38 as does the contact 20 (FIG. 5). The contact 20A is anchored at its end 35 to the substrate 22 and the insulating layer 24. The lengths and thicknesses of the metal layers 29a, 29b, 31 and 33 are chosen to give the desired final shape to the contact 20A. The length of the metal layer 31 can be similar to that of the metal layer 30 of the contact 20.

Figure 7:
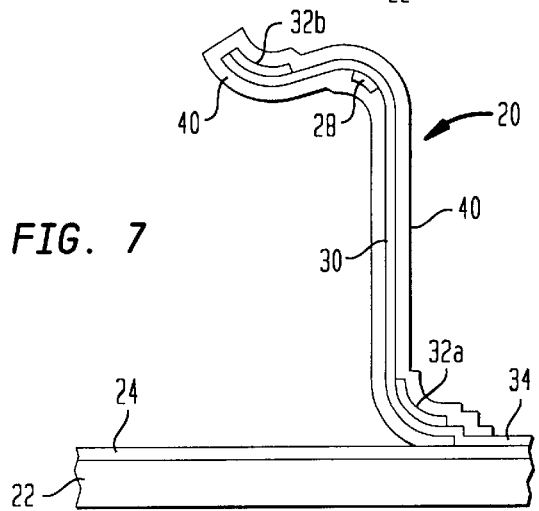
FIG. 7 is a view of the electrical contact of FIG. 5 after it has been over-plated with a stiffening metal for strength and resistance to permanent deformation.

Referring now to FIG. 7, the ultra-miniature card-edge contact 20 in its three-dimensional form has now been over-plated with a stiffening metal layer 40. This greatly strengthens the contact 20 and enables it to be substantially deformed without taking a permanent set. This is an important feature of the present invention. By way of example, the metal layer 30 can have a length of about 600 to 800 microns, a width of about 50 to 100 microns, and a thickness of a few microns. The lengths and thicknesses of the layers 28 and 32a, 32b are chosen to give the desired final shape to the contact 20. The thickness of the metal stiffening layer 40 is a few microns. The layer 40 is advantageously formed by electroplating from a proprietary "Palladium M Series Plating Solution" sold by Lucent Technologies. A metal layer (e.g., layer 40) formed from this solution has a Knoop hardness of about 600, which is very much harder than precious metals normally used for electrical contact areas (e.g., Knoop hardness of about 160 or less). It is to be understood that the contact 20A (FIG. 6) is also over-plated with an outer stiffening metal layer 40 and is interconnected to other such contacts in the same way as the contact 20.

Figure 8:
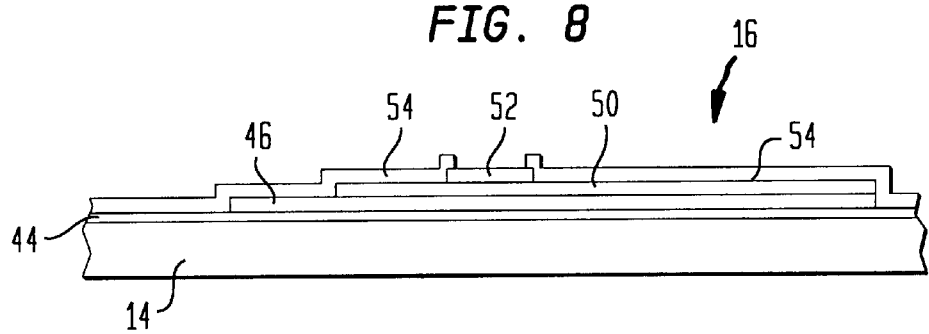
FIG. 8 is a greatly enlarged side view of an ultra-miniature surface-contacting electrical contact (such as illustrated in FIG. 1) at one stage of its fabrication in accordance with a method of the present invention.

Referring now to FIG. 8, there is shown an enlarged schematic side view, not to scale, of a partially fabricated ultra-miniature surface-contacting electrical contact 16 (see FIG. 1) still in planar form. The structure shown here comprises the substrate 14 (partially broken away), a layer 44 of insulation (e.g., $Si_3N_4$)), a thin sacrificial layer 46 (e.g., $SiO_2$), a selectively deposited (e.g., by sputtering) layer 50 of metal (e.g., Cr) with a relatively low coefficient of thermal expansion, a short layer 52 of a hard metal (e.g., W) and a layer 54 of insulation which masks the metal areas except where the layer 52 of hard metal is selectively deposited (e.g., by sputtering).

Figure 9:
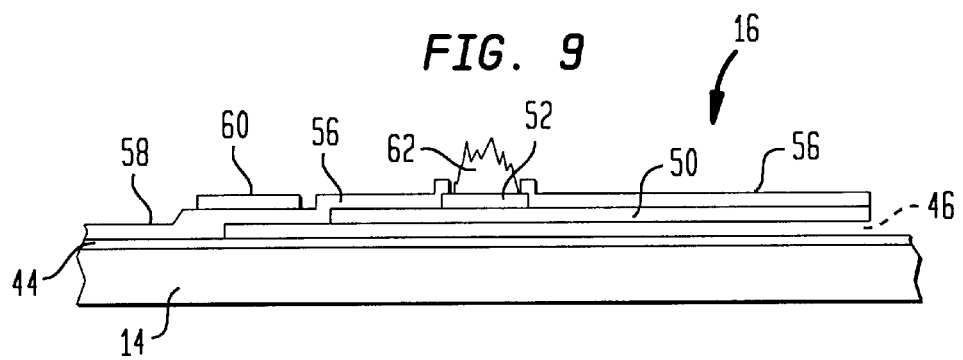
FIG. 9 is a view similar to FIG. 8 but at a later stage of fabrication of the contact.

Referring to FIG. 9, there is shown the ultra-miniature surface-contacting electrical contact 16 at a further stage of fabrication. Here the insulating layer 54 (seen in FIG. 8) has been stripped away (e.g., using hydroflouric acid), and a second layer 56 of metal (e.g., Cu) having a coefficient of thermal expansion higher than that of the metal layer 50 has been deposited thereon (e.g., by sputtering). Also, the sacrificial layer 46 has been removed (as previously described) from beneath the partially formed contact 16, as indicated by a dashed line, thereby freeing the contact 16 along most of its length from the substrate 14. The metal layer 56 at its left end 58 is joined onto an exposed portion of conductive circuit traces (not shown) and is thereby interconnected in a desired pattern with other circuit elements (not shown), and also anchored onto the substrate 14. A short-length layer 60 of metal (e.g., Cr) having a coefficient of thermal expansion like that of the metal layer 50 is selectively deposited (e.g., by sputtering) on top of the metal layer 56 near its end 58. Before the insulating layer 54 is stripped away, and to form a small contact area 62, particles of a hard abrasive contact material, such as micro-size conductive diamonds, are selectively deposited on the hard metal layer 52. The abbreviations Cu, Cr and W mean, respectively: copper, chromium, and tungsten.

Figure 10:
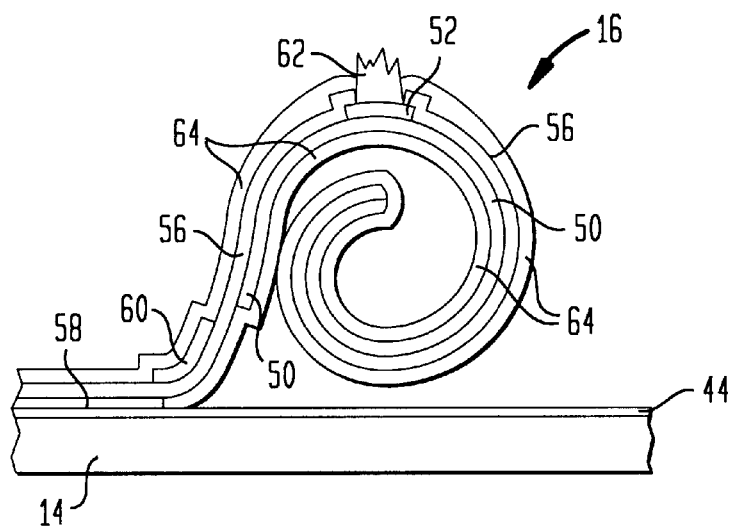
FIG. 10 is a view of the electrical contact of FIG. 9 after it has been formed into a three-dimensional shape and over-plated with a stiffening metal for strength and resistance to permanent deformation.

Referring now to FIG. 10, there is shown the ultra-miniature surface-contacting electrical contact 16 after it has been fully fabricated. The contact 16 was heated (e.g., above 300° C.) for a few seconds which caused it to lift away for most of its length from the substrate 14 by the differential expansion of the metal layer 56 (higher coefficient of thermal expansion) relative to the metal layer 60 (lower coefficient of thermal expansion). At the same time, by the differential expansion of the metal layer 56 (higher coefficient of thermal expansion) and the metal layer 50 (lower coefficient of thermal expansion), the contact 16 curled back beneath itself in a turn slightly more than 360° to form a small diameter coil. After being so coiled the metal layers 50, 56 and 60 are over-plated by electrodeposition with a layer 64 of a specialized stiffening metal (Palladium M Series Plating Solution) which substantially increases the strength and resiliency of the now completed contact 16. The contact 16 at its end 58 remains anchored to the substrate 14, as was previously explained, and is interconnected with other such contacts (see FIG. 1). By way of example, the length of the contact 16 can be about 150 microns, its width about 40 microns, the thickness of the respective metal layers 50, 56, and 60, a few microns for each layer, the thickness of the stiffening metal layer 64 a few microns, and the coiled diameter of the contact 16 about 50 microns. The curled-under configuration of the contact 16 improves its performance and is an important design feature, as will now be explained.

Figure 11:
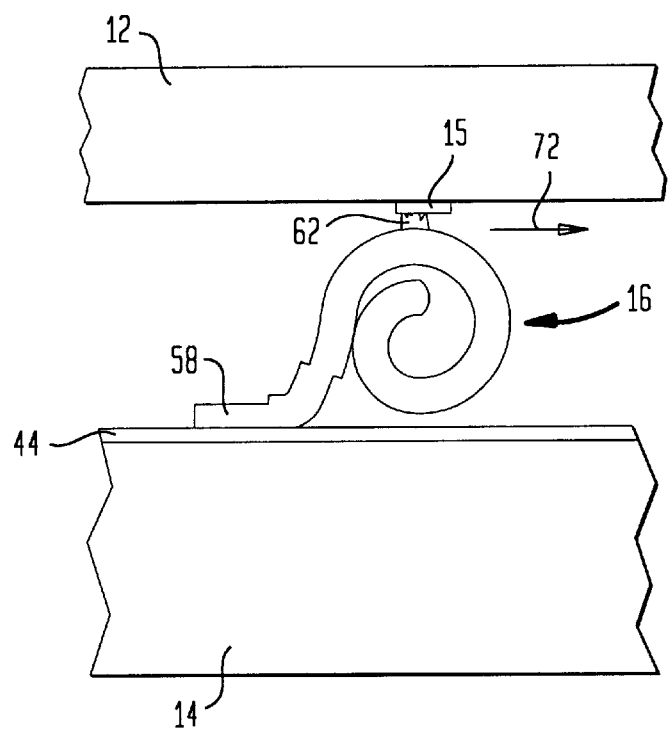
FIG. 11 is a schematic side view of the electrical contact shown in FIG. 10 making initial contact with a surface pad of a circuit chip.

Referring to FIG. 11, a contact 16 (schematically shown) has its small contact area 62 (see also FIGS. 9 and 10) in initial contact with a surface pad 15 of a chip 12. By virtue of its curled-under configuration, that portion of the electrical contact 16 between its contact area 62 and its stationary end 58 behaves like a cantilever beam. Thus as the contact area 62 is pressed downward by the chip 12 toward the substrate 14, the contact area 62 also moves to the right, as indicated by an arrow 72. This sidewise movement results in the surface of the pad 15 being "scraped" or rubbed free of oxide or insulating film by the specially provided abrasive contact area 62.

Figure 12:
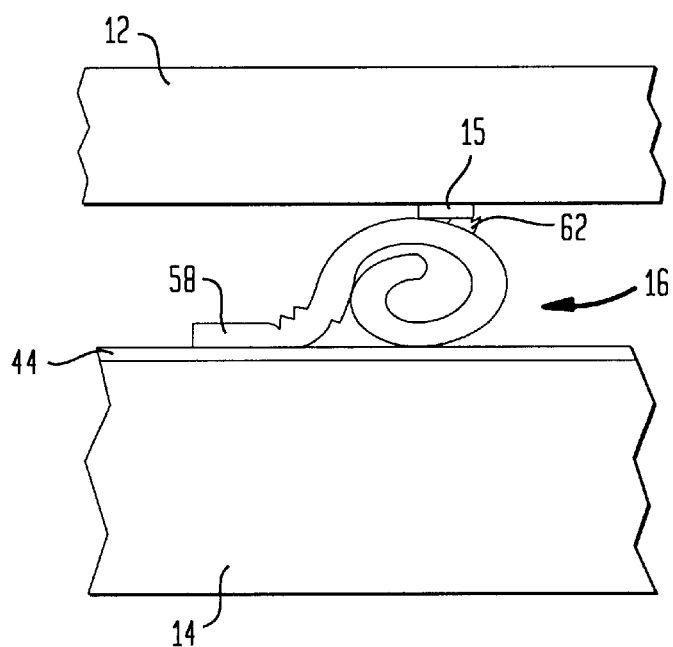
FIG. 12 is a schematic side view of the electrical contact of FIG. 11 after scraping against the surface pad and being pressed into stable, low resistance contact with the pad.

Referring now to FIG. 12, the contact 16 is shown now fully engaging the surface pad 15, and being compressed or squeezed between the substrate 14 and the chip 12. The contact area 62 has now moved to the right side of the pad 15 and a contacting portion of the electrical contact 16 immediately to the left of the contact area 62 is pressed against the scraped-clean left side of the pad 15. Stable, low-resistance electrical connection between the contact 16 and the pad 15 is accordingly achieved. Depending on the relative lengths of the contact area 62 and the pad 15, electrical connection may be entirely through the conductive diamonds of the area 62 to the pad 15, or partially through the diamonds and the metal layer 64, or solely through the metal layer 64 of the contact 16. Because of the stiffening layer 64 of metal (see FIG. 10), the thus strengthened contact 16 is able to bear against the pad 15 with sufficient force and resiliency to insure such stable, low-resistance connection. When the chip 12 is thereafter disengaged from the electrical contact 16, the latter will return substantially to its initial shape (see FIG. 10) without taking a "set". This fact is important since it enables all of the contacts 16 in engagement with each chip 12 to subsequently re-engage it or another like it, with forces above a minimum value required for stable connections. In actual measurements, a contact 16, having a stiffening metal layer 64, and with a 54-micron diameter coil was squeezed to a reduced height of about 25 microns. The force required to do this was about 5 grams. The electrical contact 16 when thereafter released, recovered to a 50-micron diameter. By contrast a 60-micron diameter contact like the contact 16 but without the stiffening metal layer 64, had irreversible deformation or "set" when squeezed by more than 2 microns.

Figure 13:
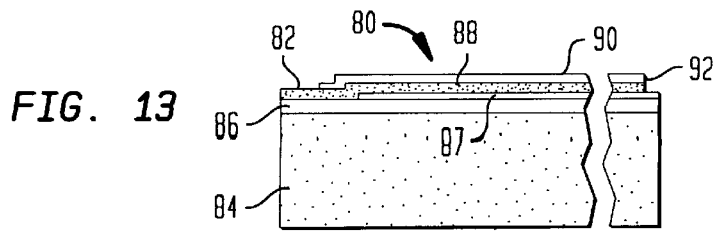
FIG. 13 is an enlarged schematic side view partially broken away of another partially fabricated ultra-miniature surface-contacting electrical connector also embodying features of the invention.

Referring now to FIG. 13, there is shown an enlarged schematic side view, not to scale and partially broken away, of a partially fabricated ultra-miniature surface-contacting electrical contact 80 shown here still in planar form, anchored at an end 82 to a substrate 84 (e.g., silicon) on which is deposited a layer 86 of insulation (e.g., silicon nitride), a sacrificial layer 87 (e.g., $SiO_2$), a main layer 88 of metal (e.g., Cu) integral with the end 82, and a top layer 90 of metal 90 (e.g., Cr) with a lower coefficient of expansion than that of the layer 88. The steps in fabrication of the contact 80 are similar to ones discussed in connection with the contact 16 of FIG. 8.

Figure 14:
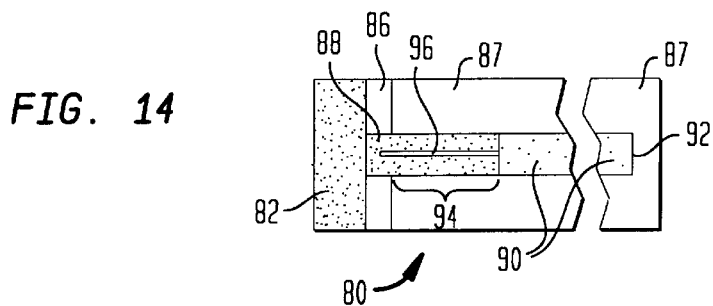
FIG. 14 is a plan (top) view of the connector shown in FIG. 13.

Referring now to FIG. 14, there is shown a plan (top) view, partially broken away, of the contact 80 showing how the metal layers 88 and 90 are patterned along their length from the fixed or left end 82 to a right end 92. The main layer 88 extends as a ribbon of uniform width beyond its end 82 to the end 92. On the other hand, the top metal layer 90 extends over and along the layer 88 for a short distance from the end 82, as indicated by a region 94, as a narrow strip 96 much narrower than the layer 88, and then broadens to the width of the layer 88 and extends over it for the rest of its length to the end 92. Because the top metal layer 90 has a lower coefficient of thermal expansion than that of the main metal layer 88, when the sacrificial layer 87 is removed and the contact 80 heated (in a way similar to that described in connection with FIGS. 8 and 9 and the contact 16) the contact 80 is raised along its length above the substrate 84. Here, because the top metal layer 90 in the region 94 is very narrow, the contact 80 is bent only slightly up in this region, whereas for the rest of the length of the contact 80 beyond the region 94 to its end 92, the contact 80 is curled back over itself. It is then as seen in FIG. 15 over-plated with a stiffening outer metal layer 98 (like the stiffening metal layer 64 shown in FIG. 9).

Figure 15:
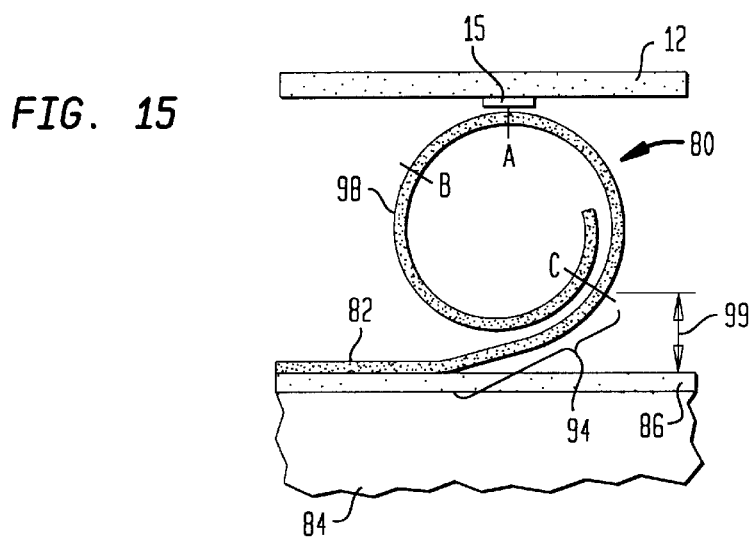
FIG. 15 is a schematic side view of a fully fabricated connector of FIGS. 13 and 14 as it is about to engage a surface pad of a circuit chip.
Figure 16:
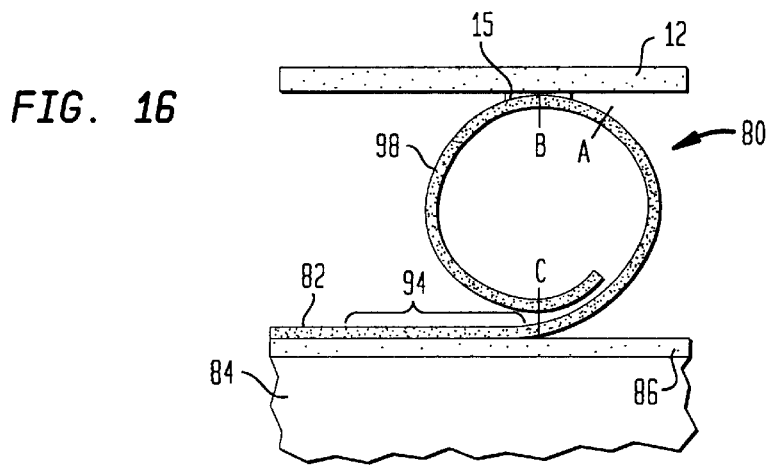
FIG. 16 is a similar view showing the connector of FIG. 15 after it has engaged the surface pad of the chip.

Referring now to FIG. 15, there is shown in schematic form a side view of a fully fabricated contact 80 about to engage a surface pad 15 of a chip 12. The contact 80, when the chip 12 and the substrate 84 are brought closer together, will initially engage the pad 15 at a point "A". Additional points "B" and "C", which are also shown, are rotated along with the point "A" clockwise as the chip 12 and the substrate 84 are moved closer and closer together. This rotation in turn, as shown in FIG. 16, results in a wiping or rubbing of the surface of the contact 80 from point A to point B across the pad 15 (similar to the scraping action of the contact 16 illustrated in FIGS. 11 & 12). Point C, which previously (FIG. 15) had been elevated as indicated at 99, is now down against the insulating layer 86 on the substrate 84. Thereafter the contact 80 may be compressed (for a desired contact force) by further movement of the chip 12 toward the substrate 84 beyond the relative positions shown in FIG. 16. If desired the contact 80 may be provided with a special contact area (not shown) similar to the contact 62 of the contact 16 in FIG. 11. By way of example, the contact 80 may have a coil diameter of about 60 microns, a width of about 40 microns, a flat length of about 150 microns, a length of the region 94 of about 40 microns, and the thicknesses of the respective metal layers 88, 90, and 96 a few microns each.

The above description is intended in illustration and not in limitation of the invention. Various changes in the contacts and in the methods of fabrication described above may occur to those skilled in the art and may be made without departing from the spirit of scope of the invention as set forth in the accompanying claims. The invention is not limited to the particular contact dimensions or materials mentioned, nor is it limited to the specific sequence of process steps set forth. It is to be noted that some of the materials and process steps mentioned herein are also described in the above-mentioned and incorporated by reference patent application, Ser. No. 08/942,623, filed Oct. 2, 1997, even though that patent application is directed to an invention different from the present invention described and claimed herein.

What is claimed is:

1. An ultra-miniature electrical contact comprising:
    an elongated conductive body having two ends and formed of at least three layers of metals selectively deposited upon each other;
    the layers comprising an inner layer, a middle layer, and an outer layer with the middle layer being located between at least one portion of each of the inner and outer layers, the middle metal layer having a coefficient of thermal expansion different from that of other layers;
    one end of the body of the contact being adapted to be affixed to a substrate;
    the inner, middle, and outer layers being proportioned and disposed relative to each other such that the body of the contact is bent by differential expansion of metal layers above the one end of the contact and the substrate; and
    at least a portion of the body of the contact near its other end is bent down toward the substrate by differential expansion of metal layers.

2. The contact of claim 1 wherein a stiffening outer metal layer is over-plated on the other layers from a palladium plating solution to give substantial strength and resiliency to the contact.

3. The contact of claim 1 wherein the middle layer has a coefficient of thermal expansion higher than that of the other layers.

4. The contact of claim 1 wherein the middle layer has a coefficient of thermal expansion lower than that of the other layers.

5. The contact of claim 2 wherein beyond its one end the body of the contact is curled under itself into a coil by differential expansion of the metal layers.

6. The contact of claim 2 wherein the body of the contact closely adjacent its other end is bent up by differential expansion of the metal layers.

7. The contact of claim 2 wherein the metal layers are roughly a few microns thick, and the width of the layers is roughly 40 microns.

8. The contact of claim 2 wherein the body of the contact has an abrasive contact area at a location along its length.

9. An ultra-miniature electrical contact comprising:
    an elongated conductive body formed of at least two layers of different metals selectively deposited upon each other;
    a portion of the contact being adapted to be fixed to a substrate;
    a remaining portion of the contact being permanently bent into a coil and lying above the substrate as a result of differential expansion of metal layers; and
    an outer stiffening metal layer being deposited over the plurality of metal layers, the stiffening metal layer being of metal electrodeposited from a palladium plating solution such that the contact has sufficient strength and resilience to effect stable low-resistance connection to a member to be contacted.

10. The contact of claim 9 wherein one metal layer is formed of copper, and another metal layer is formed of chromium.

11. The contact of claim 9 wherein the remaining portion of the contact is curled into a coil of at least one turn and a few tens of microns in diameter, the coil being raised above the substrate such that the contact has a three-dimensional shape suitable for contacting and wiping across a surface pad on an IC when pressed between the pad and substrate.

12. The contact of claim 11 wherein the body of the contact has a special abrasive contact area at a location along its length such that the contact area scrapes across the pad of an IC when pressed against it.

13. An assembly of ultra-miniature electrical contacts mounted on a substrate and suitable for electrical contact to contact areas of a device such as an integrated circuit, at least one of the ultra-miniature electrical contacts comprising:
    an elongated conductive body having two ends and formed of at least two layers of metals selectively deposited upon each other;
    one metal layer having a coefficient of thermal expansion higher than that of other layers;
    one end of the body of the contact being adapted to be affixed to the substrate, the body of the contact by differential expansion of metal layers being bent above the one fixed end of the contact and the substrate;
    at least a portion of the body of the contact near its other end being bent down toward the substrate as a result of differential expansion of metal layers; and
    an outer stiffening metal layer being electrodeposited on the other layers to give substantial strength and resiliency to the contact.

14. The contact of claim 13 wherein beyond its fixed one end the body of the contact is curled under itself in a coil.

15. The contact of claim 13 wherein the body of the contact along its length and toward its other end is bent both up and down by differential expansion of the metal layers into a free-standing shape suitable for connecting to contact areas along the edge of a circuit card.

16. The contact of claim 14 wherein the body of the contact has a hard abrasive contact area at a location along its length.

17. An assembly of ultra-miniature electrical contacts mounted on a substrate and suitable for making electrical contact to surface pads of a device such as an integrated circuit (IC), said assembly comprising:
    a substrate;
    an elongated conductive body formed on the substrate as at least two layers of different metals selectively deposited upon each other, one layer being a thin ribbon-like strip continuous along the body, another layer being selectively deposited on the one layer for a short distance along the one layer;
    a portion of the contact being affixed to the substrate;

a remaining portion of the contact being permanently bent into a three-dimensional shape above the substrate as a result of differential expansion of metal layers; and an outer stiffening metal layer being deposited over the plurality of metal layers such that the contact has sufficient strength and resilience to effect stable low-resistance electrical contact to a surface pad of an IC device.

18. The contact of claim 12 wherein one metal layer is formed of copper, and another metal layer of chromium, the outer stiffening metal layer being of metal electrodeposited from a palladium plating solution.

19. The contact of claim 17 wherein the three-dimensional portion of the contact is curled back under itself into a coil of more than one turn and has a hard abrasive contact area at a given location such that the hard contact area scrapes across the pad of an IC when pressed against it.

20. The contact of claim 17 wherein the three-dimensional portion of the contact is slightly bent above the substrate for a short length beyond the fixed portion and is thereafter curled back over itself into a coil of more than one turn such that a'surface of the contact wipes across the pad of an IC when pressed against it.

21. The contact of claim 20 wherein a first metal layer has a first coefficient of thermal expansion and a ribbon-like width along its length, and a second metal layer has a second coefficient of thermal expansion lower than the first, the second layer in the short length beyond the fixed portion having a width less than the width of the first layer, and thereafter having a width substantially equal to the width of the first layer.

* * * * *